United States Patent
Ali

(10) Patent No.: US 10,255,538 B2
(45) Date of Patent: Apr. 9, 2019

(54) MODULE EQUIPPED WITH A CAPACITOR AND AN ANTENNA, WITH IMPROVED CAPACITOR ELECTRODE ARRANGEMENT

(71) Applicant: IDEMIA FRANCE, Colombes (FR)

(72) Inventor: Ahmed Ali, Colombes (FR)

(73) Assignee: IDEMIA FRANCE, Colombes (FR)

( * ) Notice: Subject to any disclaimer, the term of this patent is extended or adjusted under 35 U.S.C. 154(b) by 0 days.

(21) Appl. No.: 15/741,071

(22) PCT Filed: Jun. 28, 2016

(86) PCT No.: PCT/FR2016/051594
§ 371 (c)(1),
(2) Date: Dec. 29, 2017

(87) PCT Pub. No.: WO2017/001761
PCT Pub. Date: Jan. 5, 2017

(65) Prior Publication Data
US 2018/0197058 A1      Jul. 12, 2018

(30) Foreign Application Priority Data

Jun. 29, 2015 (FR) ..................... 15 56063

(51) Int. Cl.
*G06K 19/00* (2006.01)
*G06K 19/07* (2006.01)
*H01G 4/40* (2006.01)
*G06K 19/077* (2006.01)
(Continued)

(52) U.S. Cl.
CPC ... *G06K 19/0726* (2013.01); *G06K 19/07783* (2013.01); *H01G 2/06* (2013.01);
(Continued)

(58) Field of Classification Search
CPC ......... G06K 19/0726; G06K 19/07783; H01G 2/06; H01G 4/40; H01L 27/13;
(Continued)

(56) References Cited

U.S. PATENT DOCUMENTS 5,140,496 A * 8/1992 Heinks .................. H01L 23/642
257/701
5,849,355 A * 12/1998 McHenry .............. H01F 41/042
427/79

(Continued)

FOREIGN PATENT DOCUMENTS

CA    2221315 A1    11/1996
EP    0737935 A2    10/1996
(Continued)

OTHER PUBLICATIONS

International Search Report dated Oct. 19, 2016, International Application No. PCT/FR2016/051594, pp. 1-7.

*Primary Examiner* — Karl D Frech
(74) *Attorney, Agent, or Firm* — MH2 Technology Law Group, LLP

(57) ABSTRACT

A module comprising a base (20) supporting a planar capacitor, an antenna, and a microcircuit electrically connected to each other to form a resonant electrical circuit, the capacitor including on a first face of the base a first electrode (30, 301, 302, 303) and a second electrode (300) disposed on a second face opposite to said first face facing said first electrode, the second electrode and the first electrode having substantially the same shape. Each electrode has at least a first portion and a second portion disposed on either side of the turns (40) of said antenna.

19 Claims, 4 Drawing Sheets

(51) Int. Cl.
*H01G 2/06* (2006.01)
*H01L 27/13* (2006.01)
*H05K 1/16* (2006.01)
*H01Q 1/22* (2006.01)
*H05K 1/02* (2006.01)
*H01Q 7/00* (2006.01)

(52) U.S. Cl.
CPC ............... *H01G 4/40* (2013.01); *H01L 27/13* (2013.01); *H01Q 1/2225* (2013.01); *H05K 1/162* (2013.01); *H01Q 7/00* (2013.01); *H05K 1/0296* (2013.01); *H05K 2201/10098* (2013.01)

(58) Field of Classification Search
CPC ........ H01Q 1/2225; H01Q 7/00; H05K 1/162; H05K 1/2096; H05K 2201/10098
USPC ........ 235/492, 487, 380, 381, 493, 488, 491
See application file for complete search history.

(56) References Cited

U.S. PATENT DOCUMENTS

| | | | |
|---|---|---|---|
| 6,359,444 B1* | 3/2002 | Grimes | G01N 22/00 324/633 |
| 2006/0164249 A1 | 7/2006 | Lutz et al. | |
| 2007/0018748 A1* | 1/2007 | Smolders | H03H 7/06 333/1 |
| 2009/0173793 A1* | 7/2009 | Kojo | H01L 23/49855 235/492 |
| 2014/0292611 A1 | 10/2014 | Kubo et al. | |

FOREIGN PATENT DOCUMENTS

| | | |
|---|---|---|
| EP | 1073009 A2 | 1/2001 |
| FR | 3013152 A1 | 5/2015 |
| FR | 3013483 A1 | 5/2015 |

\* cited by examiner

MODULE EQUIPPED WITH A CAPACITOR AND AN ANTENNA, WITH IMPROVED CAPACITOR ELECTRODE ARRANGEMENT

CROSS-REFERENCE TO RELATED APPLICATIONS

This application is a U.S. National Stage application of International Application No. PCT/FR2016/051594 filed 28 Jun. 2016, which claims priority to French Application No. 1556063 filed 29 Jun. 2015, the entire disclosures of which are hereby incorporated by reference in their entireties.

BACKGROUND OF THE INVENTION

The invention relates to the general field of electronic devices provided with antennas, for example devices of the RFID ("radio frequency identification") type equipped with near-field communication antennas.

Near-field communication antennas of RFID type devices include a plurality of turns formed by conducting paths connected to a microcircuit (currently designated by persons skilled in the art with the expression "RF chip"). RFID devices designed for near-field communication are generally configured for near-field communication in frequency bands comprised between the low frequencies (for example 125 kHz) and high frequencies (for example 30 MHz). RFID devices can be based on the ISO 14 4443 standard or the ISO 15693 standard.

To obtain a desired operation, it is necessary to have good control of the geometric parameters of the antenna so that the associated resonance frequency is well adjusted. The resonance frequency is selected to correspond to that of an external reader. The resonance frequency is calculated taking into account the electrical parameters of the microcircuit of the device.

Moreover, the antenna must be configured to receive enough of the magnetic flux of the magnetic field of the external reader, and the effective surface comprised between the turns of the antenna is adjusted for this purpose. The energy received by means of this magnetic flux is then supplied to the microcircuit, with losses that correspond to the resistance of the coil forming the antenna.

The elaboration of an RFID device designed for near-field communication is therefore performed on the basis of a compromise between the size of the antenna, the resistance losses and the resonance frequency. These parameters are selected to allow the reception of enough energy and the achievement of good performance.

There exists a strong demand for small-sized RFID devices. In numerous application such as for example connected objects, it is particularly critical to reduce the dimensions of the RFID devices, which can appear in the form of a module which can be incorporated in an object. For example, this object can be an enclosure or a bracelet in which the module is directly incorporated.

Also, the module can be arranged between two layers of plastic to form a small-format card which will subsequently be integrated into an object. By small format is meant a format the surface area of which is substantially equivalent to or less than a fourth of the surface area of an ID-1 format (85.60 mm*53.98 mm) according to the ISO7810 standard.

According to the prior art, the adjustment of the electrical parameters of the antenna is accomplished, regardless of the geometric constraints of the antenna, by compensation by connecting a capacitor to this antenna to increase the capacity of the resonant circuit comprising the antenna.

Numerous capacitor integration solutions have been proposed. In particular, it has been proposed to use surface-mounted components or planar capacitors printed directly on the surface of a printed circuit card or on a substrate.

Planar capacitors offer a good level of robustness, their capacitance value is easily calculated, and this value is easily controlled in a production chain. In fact, the capacitance value of a planar capacitor with parallel plates or electrodes is equal to:

$$\frac{\epsilon_0 \epsilon_r A_C}{d},$$

in farads

With $\epsilon_0$ the permittivity of vacuum, $\epsilon_r$ the relative permittivity of the material separating the two electrodes of the capacitor, $A_c$ the area of the facing electrodes with respect to one another, and d the distance separating the electrodes.

FIG. 1 is a top view representation of a module 1 according to the prior art, provided with an antenna and a capacitor. Such a module can be integrated into an RFID device. Here the module 1 is formed on a base 2, for example a dielectric substrate. A capacitor electrode 3 and an antenna 4 have been formed on the base 2.

The capacitor electrode 3 is a planar electrode printed on the base 2 in the form of a rectangle disposed substantially at the center of the module 1. The other electrode of this capacitor is disposed on the face of the base opposite to that visible in FIG. 1.

The antenna 4 includes turns printed around the electrode 3. Other turns of the same antenna can be printed on the opposite face.

Moreover, crossing conductive connections 6 are formed through the base, and the antenna 4 and the capacitor 3 are connected to a microcircuit 5.

This arrangement according to the prior art in which the antenna turns are positioned in the periphery, is used to increase the effective surface area of the turns of the antenna.

Generally, the relative permittivity for dielectric materials used in RFID devices is comprised between 3 and 9. The capacitance value of the capacitors therefore depends mainly on the ratio between the area of the electrodes and the distance that separates them.

Due to the size limitations imposed on these devices, it is difficult to increase the area of the electrodes.

This problem can be resolved by selecting a suitable dielectric material and a thin substrate (the electrodes of the capacitors are disposed on the opposite faces).

This being the case, the thinnest substrates, having for example a thickness smaller than 75 micrometers, are complicated to handle. This is the case of substrates made of polyethylene terephthalate (PET) or of polyimide (Kapton) which can be on the order of 40 micrometers. The steps of cutting or of placement are particularly difficult to implement on such substrates.

As can be imagined, placement errors can lead to the cutting of an antenna during a subsequent cutting step, for example for an antenna such as that illustrated in FIG. 1.

In FIG. 1, the placement error for a cutting step is limited to a value $\delta 0$ which is the smallest distance between the largest turn (or exterior turn) and an edge of the module. This value is generally too small and unsatisfactory. This value $\delta 0$ corresponds to the allowable margin of error concerning the placement of the module during a cutting step, and therefore to a maximum cutting tolerance value.

Currently, this value is less than 500 micrometers for thin, soft substrates made of polyimide.

The invention aims in particular to mitigate these disadvantages, and in particular to reduce losses during manufacture of devices comprising an antenna and a capacitor.

OBJECT AND SUMMARY OF THE INVENTION

The present invention responds to this need by proposing a module comprising a base supporting a planar capacitor, an antenna, and a microcircuit electrically connected to each other to form a resonant electrical circuit, the capacitor including on a first face of the base a first electrode and a second electrode disposed on a second face opposite to said first face facing said first electrode, the second electrode and the first electrode having substantially the same shape, or the same shape.

According to a general feature, each electrode has at least a first portion and a second portion disposed on either side of the turns of said antenna.

Thus, unlike the capacitors of the prior art, the electrodes of the capacitor are not entirely disposed in the interior of the turns of the antenna, but at least on either side of the turns formed on the first face or the second face.

It can be noted that the expression "on either side" means that the electrodes are position around the turns, outside the turns.

For this reason, each portion is positioned between the turns of the antenna and an edge of the first face (or of the second face) of the module. As a result, the antenna is displaced toward the center of the module and the distance between the largest turn and the edge of the module is increased, at least where said portions are present; the risk of cutting the antenna is thereby reduced.

Moreover, the inventors have observed that the electrodes, which are planar and larger than the antenna paths, improve the robustness of the module and facilitating its handling ("pick and place") by stiffening the edges of the base.

According to one particular embodiment, the first portion and the second portion of the first electrode are respectively disposed in the vicinity of opposite edges of said first face, the first and the second portion of the second electrode are respectively disposed in the vicinity of opposite edges of said second face, the first portion and the second portion of each electrode being electrically connected.

By vicinity of opposite edges is meant that there is no other element of the module between these electrode portions and the edge. In addition, the distance which separates the edge of the electrode portion can be zero or less than a few tens of micrometers.

The antenna and the capacitor thus occupy a greater surface area than in the solutions according to the prior art because a surface is used that was not used before because the antenna was the most exterior component and it was necessary to separate the antenna from the edge.

According to one particular embodiment, the first electrode is disposed on the periphery of the first face, the second electrode is disposed on the periphery of the second face, and the turns are surrounded by the first electrode and the second electrode.

In other words, the two portions mentioned above are part of an electrode which runs along the periphery of the module to surround the turns of the antenna of this first face.

In can be noted that by surround is meant that in a plane such as that of the first face, the electrode surrounds either the turns of the antenna which are on the face, or the projection of the turns of the antenna if they are in another plane (embedded for example).

Better stiffening is then obtained, in all directions.

According to one particular embodiment, the first portion and the second portion (which can be part of an electrode disposed on the periphery of the face) of the first electrode extend respectively to and along opposite edges of said first face, and the first portion and the second portion (which can also be part of an electrode disposed on the periphery of the face) of the second electrode extend respectively to and along opposite edges of said second face.

By extending along at least one portion of the edges, a portion of the surface is used which was impossible to occupy in the solutions of the prior art for which it was necessary to separate the turns of the antenna from the edge. A greater surface area is thus used for the antenna and the capacitor for a module having the same dimensions.

In this particular embodiment, the edge of the first face coincides, at least for a portion, with the electrode. Such a disposition can be obtained by forming a so-called pre-cutting electrode which extends beyond the location where it is desired to cut the module (cutting lines). Thus, during cutting, both the edges of the base and those of the electrode are cut.

According to one particular embodiment, for each electrode the first portion is symmetrical with the second portion with respect to a first axis of symmetry passing through the center of the module.

By extending to the edges and by presenting axial symmetry, it is understood that during cutting of the module with an electrode which prior to cutting extended beyond the cutting lines, an offset in a direction perpendicular to the first axis of symmetry would not influence the capacitance value of the capacitor, because an electrode surface area lost on one side is recovered on the other side.

According to one particular embodiment, each electrode extends to and along all the edges of the face on which it is disposed (the electrode being disposed at the periphery of said first face and said turns being surrounded by said electrode), and each electrode has symmetry with respect to the first axis of symmetry and with respect to a second axis passing through the center of the module and perpendicular to said first axis.

This particular embodiment can be obtained by forming, prior to cutting of the module, a pre-cutting electrode extending in all directions beyond all the cutting lines of the module. Thus, and because the electrode is symmetrical with respect to the two axes, cutting with an offset in any direction does not modify the capacitance value of the capacitor because the lost surface is recovered.

According to one particular embodiment, the module is an RFID module configured for near-field communication in a frequency band comprised between the low frequencies and the high frequencies.

According to one particular embodiment, the module includes at least one opening passing through the first electrode or the second electrode.

What is meant by passing through is that the opening passes through the electrode until reaching the base.

If a layer of protective material, for example a layer of plastic, is assembled against the module on a face which includes the antenna with the opening, then this plastic layer could be laminated under elevated temperature and pressure and flow by fusion into the opening to fill it. This improves the adhesion of the protection layers with the rest of the module, and better retention is achieved.

The opening(s) can be taken into account for determining the capacitance value of the capacitor.

According to one particular embodiment, said at least one opening passes through the first electrode, the base, and the second electrode.

It can be noted that the module can include several openings of this type.

The retention of the module between two layers of protective material, which will fill the openings to come into contact with the base and with themselves, is thus improved.

According to one particular embodiment, the module includes two layers of a protective material disposed on either side of the base and covering said antenna, said microcircuit, said first electrode and said second electrode, the protective material of the layers of protective material filling said at least one opening (which may or may not pass through the base, and a single electrode or both).

The invention also proposes a device in which is incorporated a module as defined above.

The invention also proposes a method of manufacturing a module comprising a base supporting a planar capacitor, an antenna, and a microcircuit electrically connected to one another to form a resonant electrical circuit, the method including:

formation of an electrode on a first face of the base, formation, on a second face opposite to said first face, of a second electrode facing said first electrode, the second electrode and the first electrode having substantially the same shape.

According to a general feature of the method, each electrode has at least a first portion and a second portion disposed on either side of the turns of said antenna.

According to a particular implementation mode, the method comprises a cutting step to obtain said module.

According to one particular implementation mode, the formation of said electrode comprises the formation of a pre-cutting electrode extending at least partially beyond cutting lines of the module.

According to one particular implementation mode, the pre-cutting electrode extends beyond the cutting lines of the module by a distance greater than a maximum cutting tolerance value.

According to one particular implementation mode, the method comprises a manufacture of several pre-cutting modules on a strip of consecutive pre-cutting modules, and cutouts of the consecutive pre-cutting modules of the strip to obtain modules.

This method can be adapted for the manufacture of each of the embodiments of a module as described above.

In particular, the electrode can extend beyond all the cutting lines of the module in one particular implementation mode.

According to one particular implementation mode, an opening is formed passing through the first electrode or the second electrode. The formation of this opening is preferably implemented before any module cutting step.

According to one particular implementation mode, said opening passes through the first electrode, the second electrode, and said base. The formation of this opening is preferably implemented prior to a module cutting step.

According to one particular implementation mode, two layers of a protective material are assembled, disposed on either side of the base and covering said antenna, said microcircuit, said first electrode, and said second electrode. The protective material of the layers of protective material filling said at least one opening. The protective material of the layers of protective material filling said opening.

The assembly of the two layers of protective material is preferably implemented prior to a module cutting step, which allows the layers to be simultaneously assembled on a large number of modules.

BRIEF DESCRIPTION OF THE DRAWINGS

Other features and advantages of the present invention will be revealed from the description given below, with reference to the appended drawings which illustrate an example of it free of any limiting character.

In the figures.

DETAILED DESCRIPTION OF TWO EMBODIMENTS

We will now describe an RFID type module equipped with a near-field communication antenna according to one embodiment of the invention.

The module of this example is a module according to the ISO 14 4443 or ISO 15693 standard, and it is configured for near-field communication.

Figure 1:
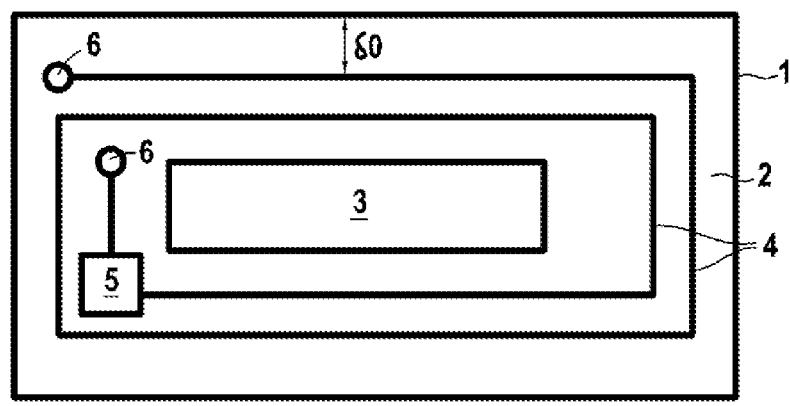
FIG. 1, already described, is a schematic representation of a module according to the prior art.
Figure 2:
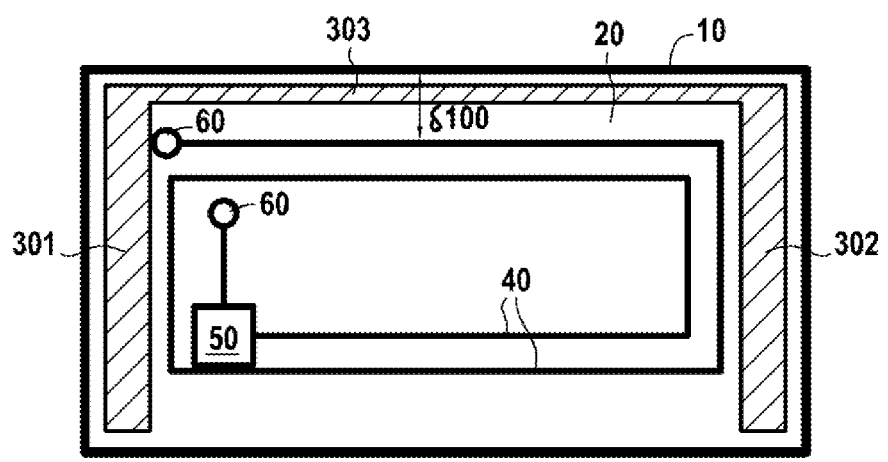
FIG. 2 is a schematic representation of a module according to the invention.

In FIG. 2, a module 10 is shown which includes a base 20, for example a base made of polyethylene terephthalate (PET) having a thickness of 75 micrometers or a base made of polyimide, of Kapton® for example, having a thickness of less than 40 micrometers. FIG. 1 is a bottom view and a first face of the base 20 can be seen in this figure.

One capacitor electrode is formed on this first face of the base 20. This electrode includes several portions 301, 302 and 303. The other electrode of the capacitor is positioned on the opposite face and facing the electrode visible on the first face, and this electrode has the same shape as the electrode on the first face.

The formation of the electrodes can be accomplished by screen printing, which allows a thickness of the order of 8 micrometers to be printed, or by etching, which allows a thickness ranging from 12 to 30 micrometers to be allowed to subsist.

The module 10 is also equipped, on the first face, with an antenna including turns 40, a microcircuit 50 and through connections 60 extending to an underlying face, the face opposite to the first face.

In this example, the portions 301 and 302 are disposed on either side of the turns 40 of the antenna. The portion 303 connects these first two portions. The two portions 301 and 302, which are larger than the antenna paths, allow the module 10 of this figure to be stiffened. This stiffening allows the handling of the module to be facilitated.

In addition, the placement of the electrode portions 301 and 302 implies that the antenna is offset toward the center of the module to satisfy the rules for spacing between the conductive elements formed on the same face. For this reason, the distance δ100, which is the smallest distance between the exterior turn and an edge of the first face, is greater than the distance δ0 described in reference to FIG. 1.

Another embodiment of the invention will now be described, in which the electrode surrounds the turns of the antenna and in which the cutting of the module is accomplished after a pre-cutting electrode extending beyond the cut edges has been formed.

The example illustrated in these figures also concerns an FRFID module for near-field communication.

In FIGS. 3 to 6, references identical to those used in FIG. 2 refer to identical elements, unless otherwise stated.

Figure 3:
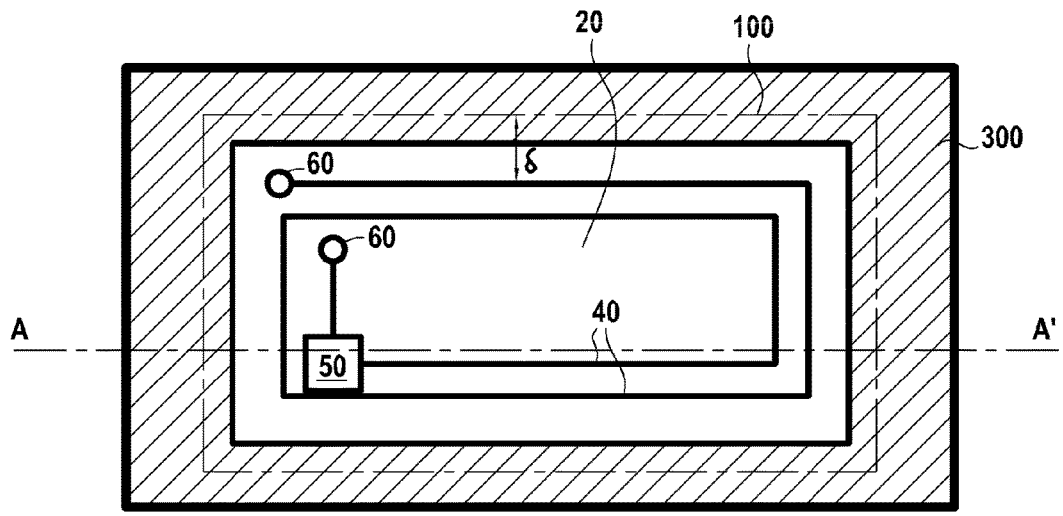
FIG. 3 is a schematic representation of a module prior to cutting.

FIG. 3 illustrates a pre-cutting module prior to a cutting step allowing a module to be obtained which will be described with reference to FIGS. 5 and 6.

The pre-cutting module of this figure is formed on a substrate that is more extended than the base 20 of the module that it is desired to form. On this substrate there has also been formed a pre-cutting electrode 300 which covers a greater surface area than the surface area occupied by the electrode of the final module.

The module is obtained by cutting through the initial electrode 300 and the substrate the desired shape and position for the module. The desired position and shape are represented by the cutting lines 100.

As can be seen in the figure, the pre-cutting electrode 300 extends well beyond the cutting lines 100, and here, the electrode obtained after cutting will surround the turns of the antenna 40 and it will be disposed on the periphery of the module. Moreover, the electrode which will be obtained is symmetrical with respect to a vertical axis and a horizontal axis which will pass through the center of the module.

Cutting can be implemented by punching, and it is during this step that risk of cutting a turn of the antenna can appear.

This being the case, here the turns of the antenna are offset toward the center with respect to the solutions of the prior art and the distance δ which is the smallest distance between the exterior turn of the antenna and the cutting lines is greater than the distance δ0 described with reference to FIG. 1.

Here, an offset of the cutting lines 100 less than the distance δ, horizontal and/or vertical (in the figure), cannot lead to obtaining a defective module, because the antenna is not cut and because the capacitance value of the capacitor is retained because the pre-cutting electrode extends beyond the cutting lines and the electrode has a horizontal symmetry and a vertical symmetry in the figure.

Such an offset causes a loss of electrode (and therefore capacitor) surface area at one location, but this surface area is recovered at another location.

It can be noted that the pre-cutting electrode extends toward the exterior of the module by at least the distance δ from any point of the cutting lines 100 for which an offset less than or equal to δ is acceptable.

In this example, then δ is in fact an acceptable margin of error regarding the cutting of the module.

It can be noted that the surface area occupied by the pre-cutting electrode 200 increases the stiffness both of the pre-cutting module and also of a strip comprising several initial modules attached to one another prior to their being cut. The handling of such a strip is thus facilitated.

Figure 4:
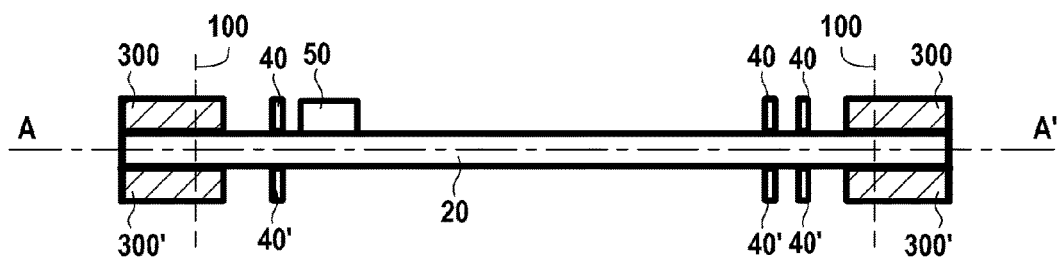
FIG. 4 is a section view of the pre-cutting module of FIG. 3.

FIG. 4 is a section view of the pre-cutting module of FIG. 3 along the axis A-A' shown in FIG. 3.

In this figure, the base 20, which has not yet been cut, the pre-cutting electrode 300, the turns of the antenna 40 and the microcircuit 50 are shown, the latter elements being disposed on the first face of the base, the upper face in the figure.

On the second face, that is the lower face in the figure, is shown, facing the pre-cutting electrode 300, another pre-cutting electrode 300', as well as turns of the antenna 40' belonging to the same antenna as the turns 40.

The pre-cutting electrodes 300 and 300' are disposed facing one another and they have the same shape.

Figure 5:
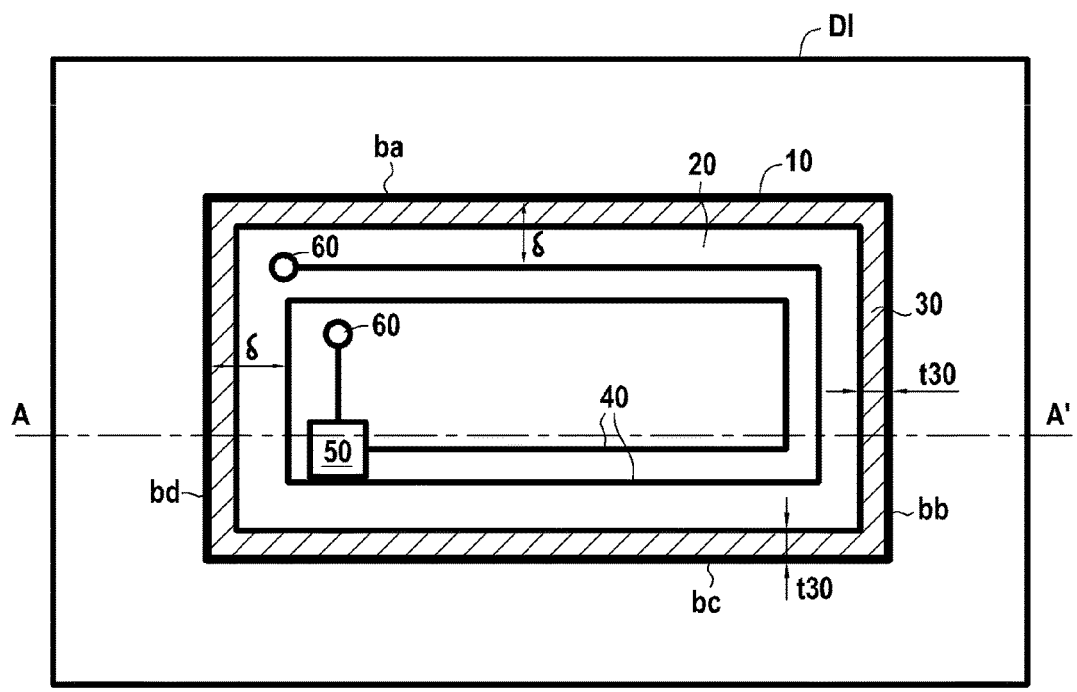
FIG. 5 is a schematic representation of a device equipped with a module according to an example of the invention.

After cutting along the cutting lines 100 shown in FIGS. 3 and 4, a module 10 is obtained, shown in FIG. 5.

In this FIG. 5 is shown a module 10 incorporated into a device DI, by overmolding for example. The device DI can be a connected object such as a bracelet.

The module 10 includes a base 20 and a capacitor electrode 30 disposed on the periphery of the first face. Here, the electrode extends to and along all the edges ba, bb, bc and bd of the first face because cutting has taken place through the pre-cutting electrode 300. Here the electrode 30 has a width t30 measured from the edge which is the same at all points around the module.

The reduction of losses during manufacture of the module 10 is connected with the distance δ separating the exterior turn of the antenna from the edge of the face of the base 20 (the smallest distance separating the exterior turn and an edge). This distance δ is greater than the distance and corresponds to a module according to the prior art. This is due to the offset of the turns of the antenna toward the center of the module.

By way of an example, the distance δ can be on the order of more or less 500 micrometers, or more or less 1 millimeter on each side.

Another advantage of this disposition of the electrode is the improvement of the stiffness of the module 10. This facilitates the handling of the module.

Figure 6:
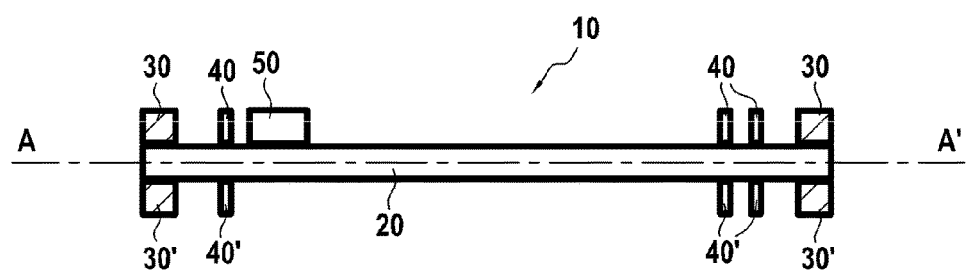
FIG. 6 is a section view of the module of FIG. 5.

FIG. 6 is a section view of the module 10 passing through the axis A-A' shown in FIG. 5.

In this figure is shown the module 10, the base 20, the electrode 30, the turns of the antenna 40 and the microcircuit 50, these latter elements being disposed on the first face of the base, the upper face in the figure.

On the second face, that is the lower face in the figure is shown, facing the electrode 30, another electrode 30', as well as antenna turns 40' belonging to the same antenna as the turns 40.

The invention makes it possible to obtain modules according to the ISO 14 4443 or ISO 15693 standard provided with an antenna and a capacitor on particularly thin substrates, because they are stiffened. As an indication, for a substrate made of Kapton (registered trademark) type polyimide having a relative permittivity equal to 3.4, it is possible to obtain capacitors with a capacitance of 60 picofarads with a geometry as illustrated in FIG. 2. Such a capacitance value can be obtained for a module having a surface area of 5 millimeters by 50 millimeters, and substrates having thickness of 75 micrometers (the area of the electrodes is then 150 millimeters squared), of 50 micrometers (the area of the electrodes is then 100 millimeters squared), or even of 25 micrometers (the area of the electrodes is then 50 millimeters squared).

It can be noted that in this example, the area is twice the thickness of the base.

Figure 7:
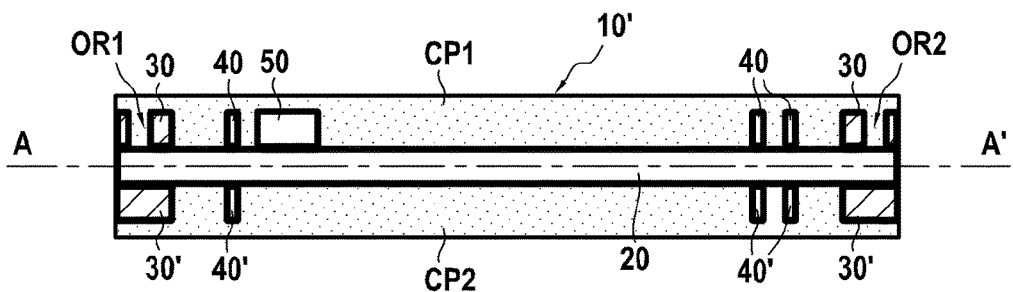
FIG. 7 is a section view of a module comprising an opening and two layers of protective material.

In FIG. 7 is shown a module 10' according to a variant of the invention. The elements bearing the same reference symbols as those described with reference to FIG. 6 are similar.

In this variant, prior to the cutting of the module, two openings OR1 and OR2 have been formed which pass through the first electrode 30. These openings can be circular and have a diameter comprised between 0.5 millimeter and 2 millimeters.

Also, prior to the cutting of the module, two layers of protective material CP1 and CP2 (made of plastic for example) have been assembled on either side of the module.

The layers of protective material are assembled with the rest of the module by lamination under elevated pressure and temperature. Thus, the protective material will flow and fill the opening where it can connect by fusion with the material of the base 20. This allows good retention of the module between the two bases to be obtained.

Figure 8:
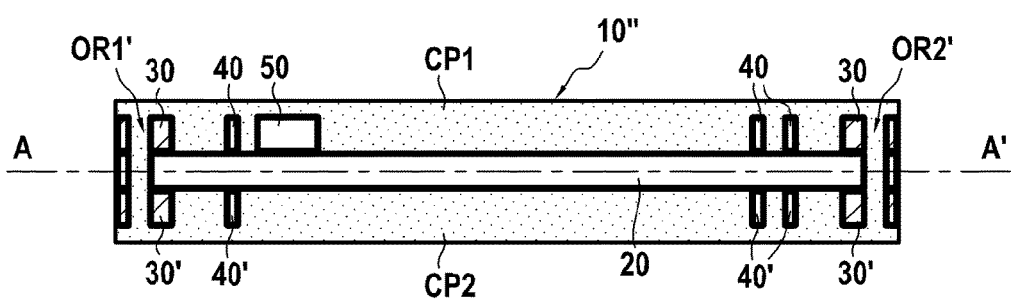
FIG. 8 is also a section view of a module comprising an opening and two layers of protective material.

In FIG. 8 is shown a module 10″ according to another variant in which two openings OR1′ and OR2′ have been formed which pass through the electrodes 30 and 30′ as well as the base. Two layers of protective material CP1 and CP2 have also been assembled.

The layers of protective material CP1 and CP2 fill the two openings and have been able to fuse together and with the base 20, which allows even better retention than that of the module 10′ described with reference to FIG. 7.

The invention claimed is:

1. A module comprising:
 a base supporting a planar capacitor, an antenna having turns, and a microcircuit electrically connected to each other to form a resonant electrical circuit,
 wherein the planar capacitor includes on a first face of the base a first electrode and a second electrode disposed on a second face opposite to said first face facing said first electrode, the second electrode and the first electrode having substantially the same shape,
 wherein each electrode has at least a first portion and a second portion disposed on either side of the turns of said antenna.

2. The module according to claim 1, wherein the first portion and the second portion of the first electrode are respectively disposed in the vicinity of opposite edges of said first face, the first and the second portion of the second electrode are respectively disposed in the vicinity of opposite edges of said second face, and the first portion and the second portion of each electrode are electrically connected.

3. The module according to claim 2, wherein the first portion and the second portion of the first electrode extend respectively to and along opposite edges of said first face, and the first portion and the second portion of the second electrode extend respectively to and along opposite edges of said second face.

4. The module according to claim 3, wherein for each electrode the first portion is symmetrical with the second portion with respect to a first axis of symmetry passing through the center of the module.

5. The module according to claim 1, wherein the first electrode is disposed on the periphery of said first face, the second electrode is disposed on the periphery of said second face, and said turns are surrounded by the first electrode and the second electrode.

6. The module according to claim 5, wherein each electrode extends to and along all the edges of the face on which it is disposed, and each electrode has symmetry with respect to a first axis of symmetry passing through the center of the module and with respect to a second axis passing through the center of the module and perpendicular to said first axis.

7. The module according to claim 1, wherein the module is a radio frequency identification (RFID) module configured for near-field communication in a frequency band comprised between the low frequencies and the high frequencies.

8. The module according to claim 1, including at least one opening passing through the first electrode or the second electrode.

9. The module according to claim 8, wherein said at least one opening passes through the first electrode, the base, and the second electrode.

10. The module according to claim 8, comprising two layers of a protective material disposed on either side of the base and covering said antenna, said microcircuit, said first electrode, and said second electrode,
 wherein the protective material fill said at least one opening.

11. A device comprising:
 a module comprising:
 a base having a first face and a second face that is opposite the first face and supporting a planar capacitor, an antenna having turns, and a microcircuit electrically connected to each other to form a resonant electrical circuit;
 wherein the planar capacitor comprises a first electrode on the first face of the base and a second electrode on the second face of the base, wherein the second electrode and the first electrode have substantially the same shape; and
 wherein the first electrode and the second electrode each have a first portion and a second portion disposed on either side of the turns of the antenna.

12. A method of manufacturing a module comprising a base supporting a planar capacitor, an antenna having turns, and a microcircuit electrically connected to each other to form a resonant electrical circuit, the method comprising:
 forming, on a first face of the base, a first electrode;
 forming, on a second face opposite to said first face, a second electrode facing said first electrode, the second electrode and the first electrode having substantially the same shape;
 wherein each electrode has at least a first portion and a second portion disposed on either side of the turns of said antenna.

13. The method according to claim 12, further comprising:
 cutting a substrate to obtain said module.

14. The method according to claim 13, wherein the forming of said first electrode comprises:
 forming a pre-cutting electrode on the substrate and extending at least partially beyond cutting lines used for cutting the substrate to obtain said module.

15. The method according to claim 14, wherein the pre-cutting electrode extends beyond the cutting lines by a distance greater than a maximum cutting tolerance value.

16. The method according to claim 12, further comprising:
 manufacturing a strip of consecutive pre-cutting modules, and
 cutting the module out of the strip of consecutive pre-cutting modules.

17. The method according to claim 12, further comprising:
 forming an opening passing through the first electrode or the second electrode.

18. The method according to claim 17, wherein said opening passes through the first electrode, the second electrode, and said base.

19. The method according to claim 17, further comprising:
  assembling two layers of a protective material, disposed on either side of the base and covering said antenna, said microcircuit, said first electrode, and said second electrode,
  wherein the protective material fills said opening.

* * * * *